(12) United States Patent
Jeon

(10) Patent No.: US 6,441,647 B2
(45) Date of Patent: Aug. 27, 2002

(54) CIRCUIT FOR INHIBITING POWER CONSUMPTION IN LOW VOLTAGE DYNAMIC LOGIC

(75) Inventor: Hyun-Kyu Jeon, Choongcheongbuk-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/782,030

(22) Filed: Feb. 14, 2001

(30) Foreign Application Priority Data

Mar. 10, 2000 (KR) .............................................. 00-12112

(51) Int. Cl.[7] .......................................... H03K 19/096
(52) U.S. Cl. ............................. 326/98; 326/95; 326/119
(58) Field of Search ............................. 326/95–98, 112, 326/119, 121

(56) References Cited

U.S. PATENT DOCUMENTS

| | | | |
|---|---|---|---|
| 5,565,795 A | * 10/1996 | Kawano | ....................... 326/81 |
| 5,610,533 A | 3/1997 | Arimoto et al. | ............... 326/33 |
| 6,275,094 B1 | * 8/2001 | Cranford, Jr. et al. | ....... 327/534 |
| 6,304,110 B1 | * 10/2001 | Hirano | ........................ 327/108 |

* cited by examiner

*Primary Examiner*—Michael Tokar
*Assistant Examiner*—Anh Q. Tran
(74) *Attorney, Agent, or Firm*—Fleshner & Kim, LLP

(57) ABSTRACT

The present invention relates to a circuit that prevents or reduces power consumption in a dynamic logic circuit. The circuit according to the present invention that inhibits power consumption effectively reduces subthreshold leakage current particularly when generated in a standby state of the dynamic logic. The present invention can include a dynamic logic provided with first and second MOS transistors of a conductive type different from each other and a power selection unit. The power selection unit outputs first and second voltages different from each other according to an output level of the dynamic logic. The power selection unit outputs a power voltage and a substrate voltage as first and second voltages when the output of the dynamic logic is at a high level, or outputs a boosting voltage and a ground voltage as the first and second voltages when the output of the dynamic logic is at a high level.

24 Claims, 4 Drawing Sheets

CIRCUIT FOR INHIBITING POWER CONSUMPTION IN LOW VOLTAGE DYNAMIC LOGIC

BACKGROUND OF THE INVENTION

1. Field of the Invention

The present invention relates to a semiconductor integrated circuit and, in particular, to a semi-conductor integrated circuit for power consumption.

2. Background of the Related Art

FIGS. 1A and 1B illustrate related art dynamic logic using a precharge operation. As illustrated in FIG. 1A, the related art dynamic logic includes a PMOS transistor Mp1 for pulling up an output node 50 to a VDD level in a precharge operation, a NMOS transistor Mn1 for blocking a pull-down path in the precharge operation and a n-logic 10 connected between the output node 50 and the NMOS transistor Mn1.

As illustrated in FIG. 1B, the related art dynamic logic may also include a NMOS transistor Mn2 for pulling down an output node 60 to a VSS level in a precharge operation, a PMOS transistor MP2 for blocking a pull-up path in the precharge operation and a p-logic 11 connected between the PMOS transistor Mp2 and the output node 60. Gates of the PMOS transistors Mp1 and Mp2 and NMOS transistors Mn1 and Mn2 receive a clock signal CLK, and the back gates (i.e., substrate node) of the PMOS transistors Mp1 and Mp2 and NMOS transistors Mn1 and Mn2 receive a power voltage VDD and a ground voltage VSS, respectively. In addition, a plurality of signals [in(0)~in(N)] are inputted to the n-logic 10 and the p-logic 11.

The operation of the related art dynamic logic in FIGS. 1 and 2 will now bw described. In the related art dynamic logic, a precharge state is a standby state, and an evaulation state is an active state.

In the stanby state, a clock signal CLK of low level (logic "0") is applied to the dynamic logic 100 illustrated in FIG. 1A. Upon receipt of the low level clock signal CLK, the PMOS transistor Mp1 connecting the power voltage VDD and the output node 50 are turned on, and the NMOS transistor Mn1 connecting the n-logic 10 and the ground voltage VSS is turned off. Thus, the output node 50 is pulled up to the VDD level through the turned-on PMOS transistor Mp1, and thereby the output OUT of the dynamic logic 100 turns into a high level (logic "1"). The pull-down path is blocked by the turned off NMOS transistor Mn1. In the active state, a clock signal CLK of high level (logic "1") is applied to the dynamic logic 100. The PMOS transistor Mp1 is turned off and the NMOS transistor Mn1 is turned on, and the output OUT of the dynamic logic 100 is determined by levels of signals [in(0)~in (N)] inputted to the n-logic 10. If the signals [in(0)~in(N)] are all at a high level, the output node 50 is pulled down to the VSS level, and the output OUT of the dynamic logic 100 is driven to a low level. If at least one of the signals [in(0)~in(N)] is at a low level, the output OUT of the dynamic logic 100 remains at the same logic value (i.e., logic "1") as in the standby state.

The related art dynamic logic 101 illustrated in FIG. 1B operates symmetrically with the dynamic logic 100 illustrated in FIG. 1A. Accordingly, a detailed description is omitted here.

In semiconductor integrated circuits, a lower power voltage is increasingly used to improve the reliability of the device and reduce power consumption. Therefore, when implementing a low voltage circuit, the threshold voltage (Vt) of the MOS transistor has to be reduced to prevent a decrease in operating speed. However, if a MOS transistor with a low threshold voltage (low-Vt) is used for implementing a low voltage dynamic logic, subthreshold voltage leakage current flows through the pull-down path or pull-up path in the standby state or in the active state.

For example, when the NMOS transistor Mn1 and the PMOS transistor Mp1 are implemented as a low threshold voltage MOS transistor in FIG. 1A, the NMOS transistor Mn1 that should be turned-off in the standby state is turned on, or the PMOS transistor Mp1 that should be turned-off in the active state is turned on. As a result, a leakage current flows through the channel of the turned-on NMOS transistor Mn1 or PMOS transistor Mp1 and causes serious power dissipation. This power dissipation phenomenon is increased in the case that the entire circuit remains in a precharge state for a long time, that is, in the standby state.

Accordingly, many attempts are currently being made to reduce s subthreshold leakage current for logic circuits. U.S. Pat. No. 5,610,533 illustrates a logic circuit (e.g., FIG. 6) for reducing subthreshold leakage current.

The conventional logic circuit in U.S. Pat. No. 5,610,533 reduces the subthreshold leakage current by varying the voltage applied to the back gates of the PMOS transistor and NMOS transistor according to a clock signal. In other words, the conventional logic circuit reduces subthreshold voltage by applying voltages VPP and VBB to the back gates of the PMOS transistor and NMOS transistor, respectively, and thus increases the threshold voltage value. At this time, the voltage VPP is larger than the power voltage VDD, and the voltage VBB is smaller than the ground voltage VSS.

As described above, the conventional logic circuit has various disadvantages. The conventional logic circuit has an increased size because an additional clock signal generator has to be provided in order to reduce subthreshold current. In particular, a circuit that discriminates between the standby state and the active state has to be provided so that the clock signal generator generates clock signals different from each other according to a standby or an active operation mode.

The above references are incorporated by reference herein where appropriate for appropriate teachings of additional or alternative details, features and/or technical background.

SUMMARY OF THE INVENTION

An object of the invention is to provide a semiconductor integrated circuit that substantially obviates one or more of problems caused by disadvantages or limitations of the related art.

Another object of the present invention is to provide a logic circuit that reduces power consumption in a low voltage integrated circuit.

Another object of the present invention is to provide a circuit that inhibits power consumption in a low voltage dynamic logic that is caused by a subthreshold leakage current.

Another object of the present invention is to provide a circuit that inhibits power consumption in a low voltage dynamic logic that reduces its chip area and power consumption due to subthreshold leakage current.

Another object of the present invention is to provide a circuit that inhibits power consumption in a low voltage dynamic logic that reduces a circuit size to increase chip integration.

Another object of the present invention is to provide a circuit for inhibiting power consumption in a low voltage dynamic logic that controls the substrate voltage of a MOS transistor according to an output level of the dynamic logic in an active and standby modes.

In order to achieve at least the above objects in a whole or in part, there is provided a circuit for inhibiting power consumption in a low voltage dynamic logic in accordance with the present invention that includes a dynamic logic provided with first and second MOS transistors of different conductive types and a power selector that outputs first and second voltages different from each other as a substrate voltage of the first and second transistors according to an output level of the dynamic logic. If the output of the dynamic logic is at a high level, the power selection unit outputs a power voltage and a substrate voltage as the first and second voltages, and when the output of the dynamic logic is at a low level, the power selection unit outputs a boosting voltage and a ground voltage as the first and second voltages, respectively.

To further achieve the above objects in whole or in part, and in accordance with the present invention, a circuit for reducing power consumption that includes a dynamic logic that includes first and second transistors and a power selection unit that outputs first and second voltages different from each other as a substrate voltage of the first and second transistors according to an output of the dynamic logic.

To further achieve the above objects in whole or in part, and in accordance with the present invention, a circuit for reducing power consumption in a low voltage dynamic logic is provided that includes a low voltage dynamic logic provided with first MOS transistor having a first conductive type and a second MOS transistor having a second conductive type different from the first conductive type, a first power selection unit that applies one of a first prescribed voltage and a second prescribed voltage to a back gate of the first MOS transistor according to an output signal of the dynamic logic, and a second power selection unit that applies one of a third voltage and a fourth voltage to a back gate of the second MOS transistor according to the output of the dynamic logic.

To further achieve the above objects in whole or in part, and in accordance with the present invention, a circuit that reduces power consumption in a low voltage integrated circuit is provided that includes a low voltage dynamic logic provided with first MOS transistor having a first conductive type and a second MOS transistor having a second conductive type different from the first conductive type, a logic gate that logically processes an output signal of the dynamic logic, a first PMOS transistor that outputs a boosting voltage to a back gate of the first MOS transistor according to the output signal of the dynamic logic, a second PMOS transistor that outputs a first prescribed voltage to the back gate of the first MOS transistor according to an output signal of the logic gate, a first NMOS transistor that outputs a substrate voltage to a back gate of the second MOS transistor according to the output signal of the dynamic logic, and a second NMOS transistor that outputs a second prescribed voltage to the back gate of the second MOS transistor according to the output signal of the logic gate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2A:
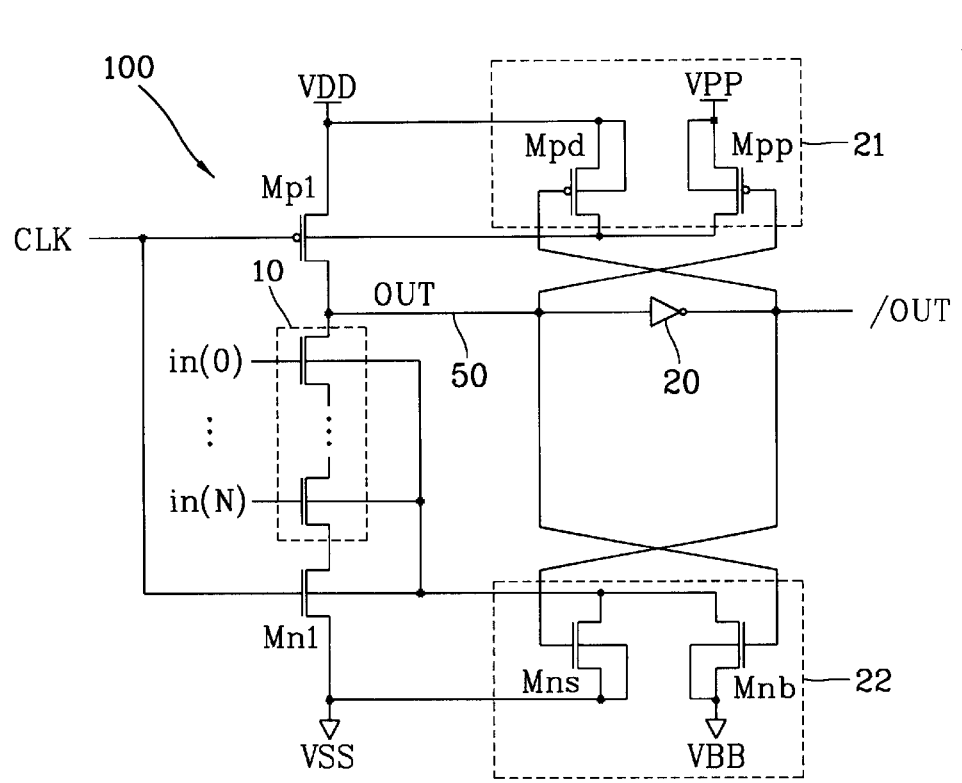
FIGS. 2A and 2B are diagrams showing preferred embodiments of a circuit that reduces power consumption in a dynamic logic in accordance with the present invention.
Figure 2B:
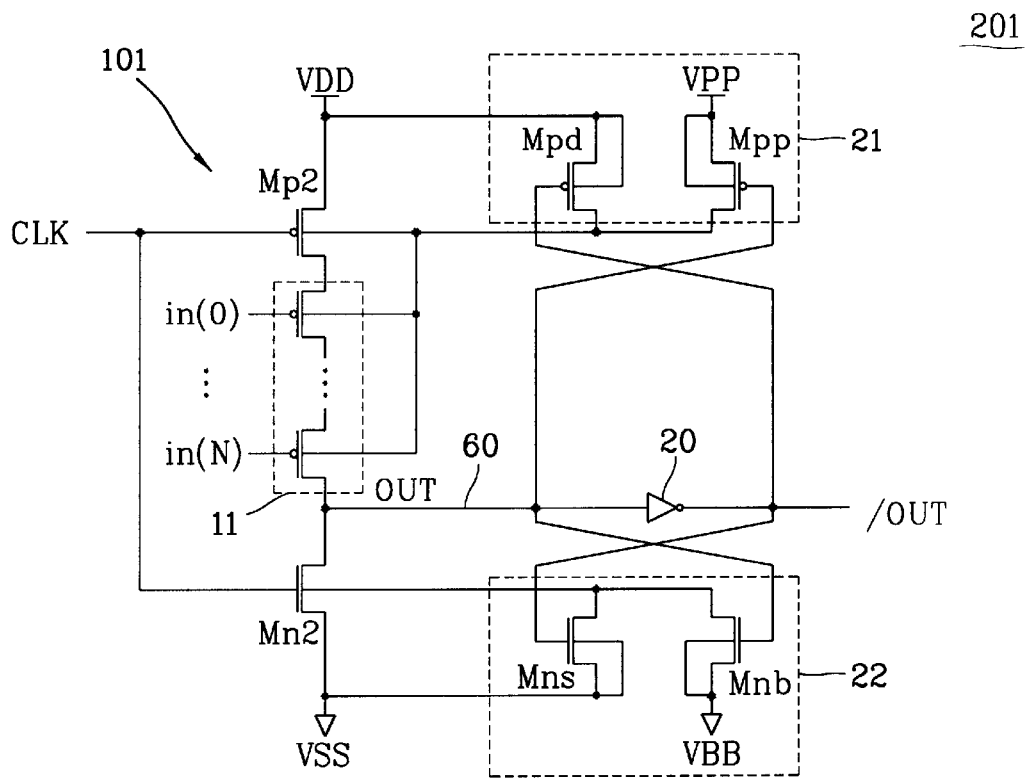

FIGS. 2A and 2B are diagrams that illustrate first and second preferred embodiments, respectively, of a circuit that reduces power consumption in a low voltage dynamic logic circuit in accordance with the present invention. As shown in FIGS. 2A and 2B, circuits 200 and 201 that reduce power consumption in the low voltage dynamic logic in accordance with the first and second preferred embodiments each further include an inverter 20 and first and second power selection units 21 and 22. The circuits 200 and 201 also include the related art dynamic logic 100 and 101, respectively. The related art dynamic logics 100 and 101 were described above and a detailed description is omitted here.

The inverter 20 is coupled to output nodes 50, 60 of the dynamic logic 100, 101. Back gates of MOS transistors within an n-logic 10 are coupled to an output node of the second power selection unit 22, and back gates of MOS transistors within a p-logic 11 are coupled to an output node of the first power selection unit 21.

As shown in FIG. 2A, the first power selection unit 21 includes a PMOS transistor Mpp for applying a boosting voltage VPP to the back gate of a PMOS transistor Mp1 according to the output signal OUT of the dynamic logic 100. A PMOS transistor Mpd applies a power voltage VDD to the back gate of the PMOS transistor Mp1 according to the output of the inverter 20. The second power selection unit 22 includes a NMOS transistor Mnb for applying a substrate voltage VBB to the back gate of a NMOS transistor Mn1 according to the output signal OUT of the dynamic logic 100. An NMOS transistor Mns applies a ground voltage VSS to the back gate of the NMOS transistor Mn1 according to the output of the inverter 20.

Operations of the first preferred embodiment of a circuit for inhibiting power consumption in a dynamic logic in accordance with the present invention will now be described. As shown in FIG. 2A, all the MOS transistors configuring the circuit have a low threshold voltage (low-Vt).

In a standby (i.e, precharge) state, if a clock signal CLK of low level is received, the PMOS transistor Mp1 of the dynamic logic 100 is turned on while the NMOS transistor Mn1 is turned off. When the PMOS transistor Mp1 is turned on, the output node 50 is pulled up to the power voltage (e.g. VDD) level. Then the output signal OUT of the dynamic logic 100 turns into a high level, and the output signal/OUT of the inverter 20 turns into a low level.

Figure 3A:
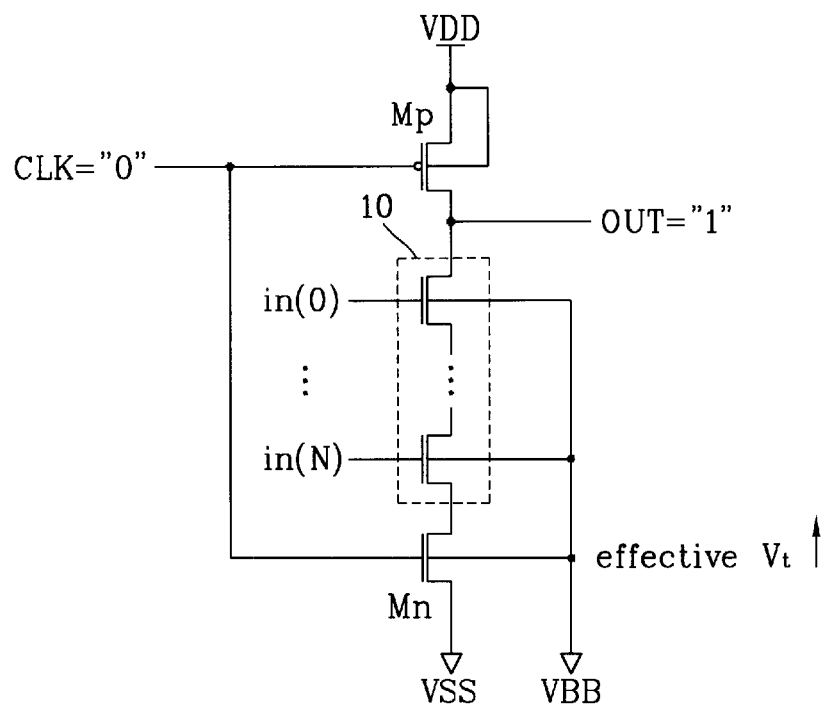
FIG. 3A is a diagram showing exemplary voltages provided for a standby state in the circuit of FIG. 2A.

Once the output signal OUT of the dynamic logic 100 and the output signal/OUT of the inverter 20 turn into a high level and a low level, respectively, the first power selection unit 21 outputs a power voltage VDD to the back gate of the PMOS transistor Mp1, and the second power selection unit 22 applies a substrate voltage VBB to the back gates of the MOS transistors of the n logic 10 and the NMOS transistor Mn1. That is, only the PMOS transistor Mpd of the first power selection unit 21 and the NMOS transistor Mnb of the second power selection unit 22 are turned on by the output signal OUT of the dynamic logic 100 and the output signal/OUT of the inverter 20. In this state, the circuit of FIG. 2A operates as a circuit shown in FIG. 3A.

Therefore, the PMOS transistor Mp1 performs a normal pull-up operation by remaining at the existing threshold voltage (Vt), and the NMOS transistor Mn1 is more strongly turned off by an increase in effective threshold voltage (Vt.eff) caused by the substrate voltage VBB inputted to the back gate. As a result, subthreshold leakage current flowing between the output node 50 and the ground voltage VSS is reduced or effectively inhibited by the turned-off NMOS transistor Mn1.

In the active (i.e., evaluation) state, if a clock signal CLK of high level is received as shown in FIG. 2A, the PMOS transistor Mp1 of the dynamic logic 100 is turned off while the NMOS transistor Mn1 is turned on. In the active state, however, since the n-logic is operated, the output signal OUT of the dynamic logic 100 and the output signal/OUT of the inverter 20 are determined by the levels of input signals [in (0)~in(N)].

Figure 3B:
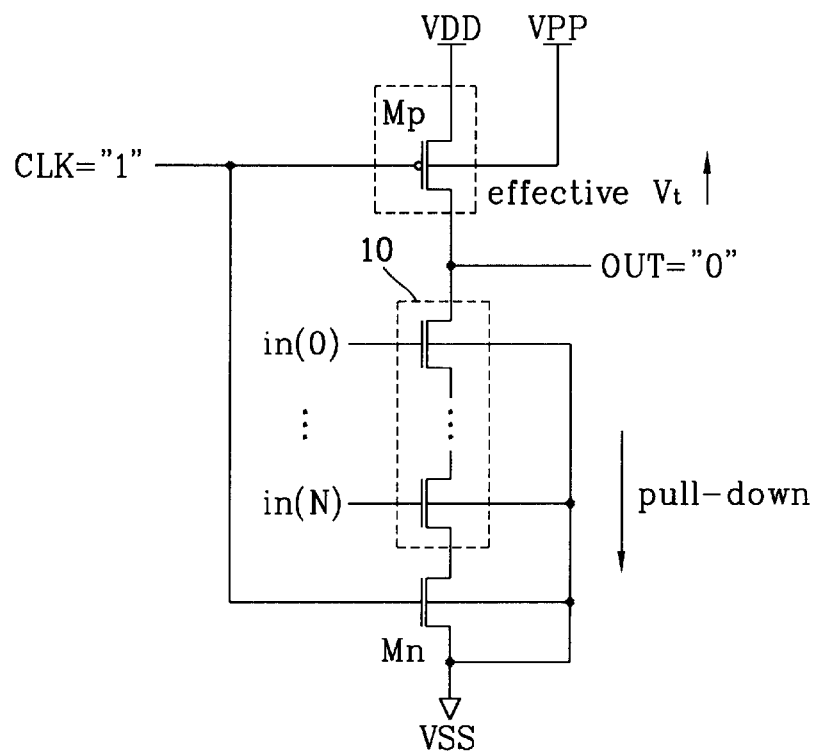
FIG. 3B is a diagram showing exemplary voltages provided for an active state and input signals all being at a high level in the circuit of FIG. 2A.

Operations where the input signals [in(0)~in(N)] are all at a high level in FIG. 2A will now be described. If input signals [in(0)~in(N)] are all at a high level, the output signals OUT and/OUT of the dynamic logic 100 and inverter 20 turn into a low level and a high level, respectively, because the NMOS transistor Mn1 is turned on. As a result, only the PMOS transistor Mpp of the first power selection unit 21 and the NMOS transistor Mns of the second power selection unit 22 are turned on. In this state, the circuit of FIG. 2A operates as a circuit shown in FIG. 3B. That is, as illustrated in FIG. 3B, a boosting voltage VPP is inputted to the back gate of the PMOS transistor Mp1, and a ground voltage VSS is inputted to the back gates of the MOS transistors of the n-logic 10 and the NMOS transistor Mn1.

Therefore, the n-logic 10 and the NMOS transistor Mn1 perform a normal pull-down operation by remaining at the existing threshold voltage (Vt), and the PMOS transistor Mp1 is more strongly turned off by an increase in effective threshold voltage (Vt.eff) caused by the boosting voltage VPP. As a result, subthreshold leakage current flowing between the power voltage VDD and the output node 50 is reduced or effectively inhibited by the turned-off PMOS transistor Mp1.

Operations where at least one of the input signals [in(0)~in(N)] are at a low level as shown in FIG. 2A will now be described. If at least one of the input signals are at a low level, the output signals OUT and/OUT of the dynamic logic 100 and the inverter 20 turn into a high level and a low level, respectively, because the output node 50 needs to remain at the same voltage level as the prior state (i.e., standby state).

Figure 3C:
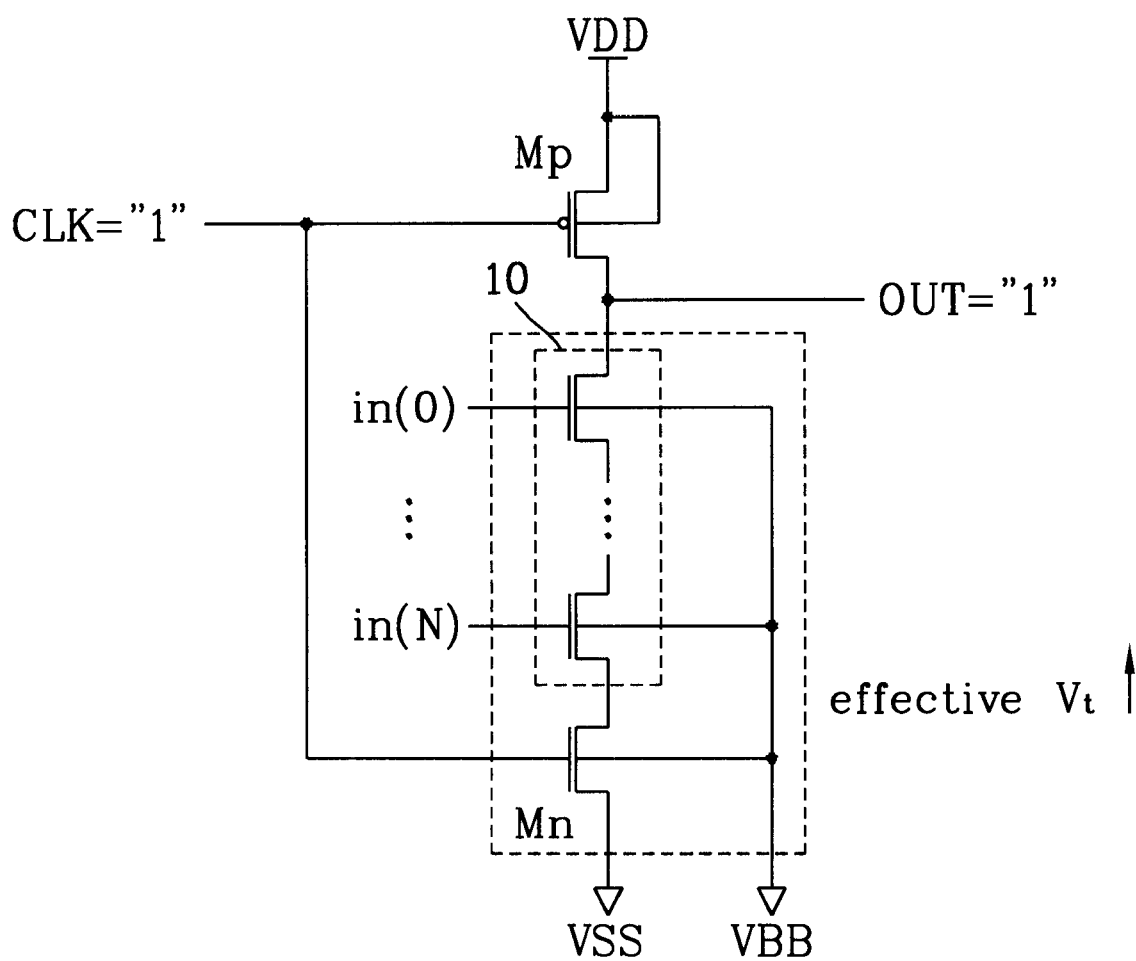
FIG. 3C is a diagram showing voltages provided for an active state and more than one input signal being at a low level in the circuit of FIG. 2A.

When the output signals OUT and/OUT of the dynamic logic 100 and the inverter 20 are at a high level and a low level, respectively, the PMOS transistor Mpd of the first power selection unit 21 and the NMOS transistor Mnb of the second power selection unit 22 are turned on. In this state, the circuit of FIG. 2A operates as a circuit shown in FIG. 3C. As illustrated in FIG. 3C, a power voltage VDD is inputted to the back gate of the PMOS transistor Mp1, and a substrate voltage VBB is inputted to the back gates of the MOS transistors of the n-logic 10 and the NMOS transistor Mn1.

Therefore, the PMOS transistor Mp1 perform a normal pull-up operation by remaining at the existing threshold voltage (Vt), and the n-logic 10 and the NMOS transistor Mn1 are more strongly turned off by an increase in effective threshold voltage (Vt.eff). As a result, subthreshold leakage current flowing between the output node 50 and the ground voltage VSS is reduced or effectively inhibited by the n-logic 10 and the NMOS transistor Mn1.

Table 1 illustrates a change in threshold voltage of the PMOS transistor Mp1 and NMOS transistor Mn1 in the standby or active state.

TABLE 1

| | | Active state | |
|---|---|---|---|
| | Standby State | OUT = "0" | OUT = "1" |
| Mp1 | Remains at constant Vt.eff | Increase in Vt.eff | Remains at constant Vt.eff |
| Mn1 | Increase in Vt.eff | Remains at constant Vt.eff | Increase in Vt.eff |

Figure 1A:
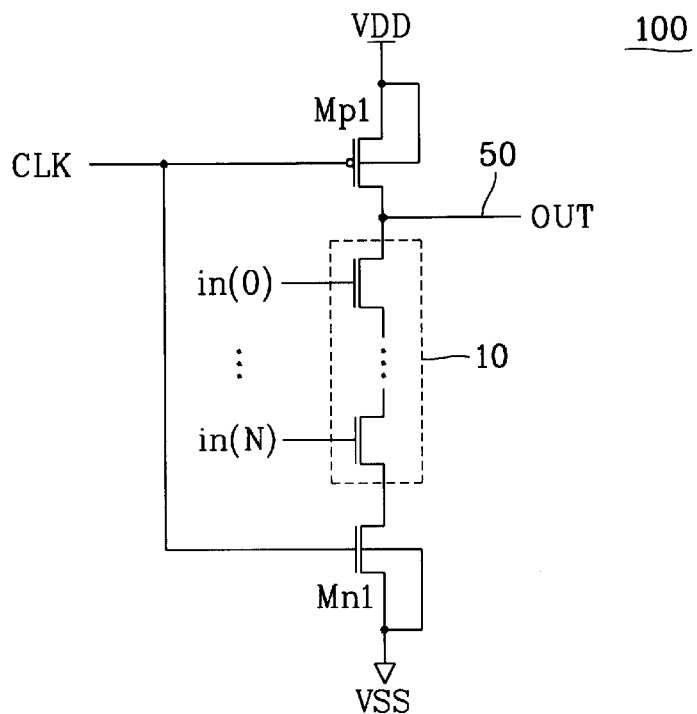
FIGS. 1A and 1B are diagrams showing related art dynamic logic using a precharge operation.
Figure 1B:
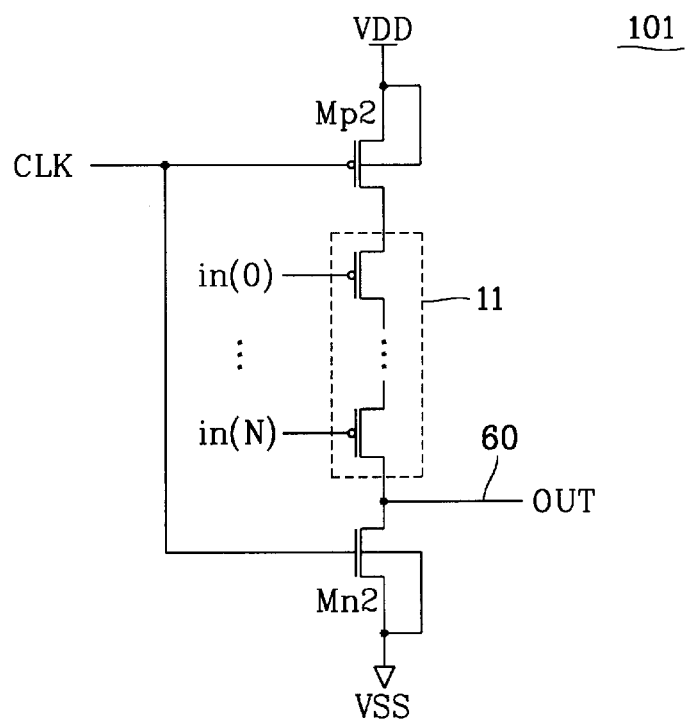

Operations of the circuit 201 for inhibiting power consumption in a low voltage dynamic logic illustrated in FIG. 2B is similar to that of the circuit 101 for inhibiting power consumption in a dynamic logic illustrated in FIG. 1B. However, in the standby state, a boosting voltage VPP and a ground voltage VSS are inputted to the back gates of the PMOS transistor Mp2 and NMOS transistor Mn2, respectively, as shown in FIG. 2B. In addition, in the active state, if the output signal OUT of the dynamic logic 101 is at a low level, a boosting voltage VPP and a ground voltage VSS are inputted to the back gates of the PMOS transistor Mp2 and NMOS transistor Mn2, respectively, or if the output OUT of the dynamic logic 101 is at a high level, a power voltage VDD and a substrate voltage VBB is inputted to the back gates of the PMOS transistor Mp2 and NMOS transistor Mn2, respectively.

Consequently, the circuit 201 for inhibiting power consumption in a low voltage dynamic circuit illustrated in FIG. 2B is capable of reducing or effectively inhibiting subthreshold voltage flowing in the standby state or the active state. Operations of the first and second power selection units 21, 22 in the circuit 201 are similar to the circuit 200 shown in FIG. 2A, so a detailed description is omitted here.

It will be appreciated that preferred embodiments according to the present invention have been described herein are merely illustrative of a few applications of the principles of the invention. Numerous modifications may be made by those skilled in the art without departing from the true spirit and scope of the invention.

As described above, preferred embodiments of a circuit that reduces leakage current and methods of operating the same have various advantages. In the preferred embodiments, subthreshold leakage current can be reduced or effectively inhibited, particularly, in the standby state in which the entire circuit has to remain at the precharge state for a long time, by controlling the substrate voltage of the MOS transistor according to the output of the dynamic logic. In the active state, the preferred embodiments can reduce unnecessary power consumption during operation by blocking a leakage path. Accordingly, there is an effect of remarkably reducing power consumption of a low voltage semiconductor circuit such as a Programmable Logic Array (PLA), etc. In addition, the circuit in accordance with the preferred embodiments controls the substrate voltage of the MOS transistor by detecting the output of the dynamic logic by itself, rather than by providing an additional circuit. Therefore, there is an effect that a chip area or layout can be reduced by controlling substrate voltage by a small sized circuit configuration when fabricating a circuit.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for reducing power consumption, comprising:
   a dynamic logic that includes first and second transistors; and
   a power selection unit that outputs first and second voltages different from each others as a substrate voltage of the first and second transistors according to an output of the dynamic logic, wherein the power selection unit comprises,
      a third transistor that outputs a boosting voltage to the back gate of the first transistor according to the output of the dynamic logic,
      a fourth transistor that outputs a power voltage to the back gate of the first transistor according to the output of the dynamic logic,
      a fifth transistor that outputs a substrate voltage to the back gate of the second transistor according to the output of the dynamic logic, and
      a sixth transistor that outputs a ground voltage to the back gate of the second transistor according to the output of the dynamic logic.

2. The circuit of claim 1, wherein the first and second transistors are MOS transistors that have a low threshold voltage.

3. The circuit of claim 1, wherein the first and second transistor are a conductivity type different from each other.

4. The circuit of claim 1, wherein the first transistor is a p-conductivity type that is enabled in a standby state, and the second transistor is a n-conductivity type that is enabled in an active state.

5. The circuit of claim 1, wherein when the output of the dynamic logic is at a first prescribed level, the first voltage is a power voltage and the second voltage is a substrate voltage.

6. The circuit of claim 5, wherein when the output of the dynamic logic is at a second prescribed level, the first voltage is a boosting voltage and the second voltage is a ground voltage, and wherein the power voltage is less than the boosting voltage, and wherein the substrate voltage is less than the ground voltage.

7. The circuit of claim 1, wherein the power selection unit comprises a logic gate that logically processes the output of the dynamic logic.

8. The circuit of claim 7, wherein the first and second transistors are MOS transistors, the third and fourth transistors are PMOS transistors, the fifth and sixth transistors are NMOS transistors and the logic gate is an inverter.

9. A circuit for reducing power consumption in a low voltage dynamic logic, comprising:
   a low voltage dynamic logic provided with first MOS transistor having a first conductive type and a second MOS transistor having a second conductive type different from the first conductive type;
   a first power selection unit that applies one of a first prescribed voltage and a second prescribed voltage to a backgate of the first MOS transistor according to an output signal of the dynamic logic; and
   a second power selection unit that applies one of a third prescribed voltage and a fourth prescribed voltage to a back gate of the second MOS transistor according to the output signal of the dynamic logic, wherein the first power selection unit comprises,
      a first transistor that outputs a boosting voltage to the back gate of the first MOS transistor according to the output signal, and
      a second transistor that outputs a power voltage to the back gate of the first MOS transistor according to the output signal.

10. The circuit of claim 9, wherein the first and second transistors have a low threshold voltage.

11. The circuit of claim 10, wherein the first MOS transistor is a p-type enabled in a first operating state of the dynamic logic, and the second MOS transistor is a n-type enabled in a second operating state of the dynamic logic.

12. The circuit of claim 9, wherein the first and second voltages are a boosting voltage and a power voltage, respectively, and wherein the first power selection unit outputs the power voltage when the output signal is at a high level and outputs the boosting voltage when the output signal is at a low level.

13. The circuit of claim 9, wherein the third and fourth voltages are a substrate voltage and a ground voltage, respectively, and wherein the second power selection unit outputs the substrate voltage when the output signal is at a high level and outputs the ground voltage when the output signal is at a low level.

14. The circuit of claim 9, wherein the second transistor outputs tha power voltage to the back gate of the first MOS transistor according to an inverted output signal of the dynamic logic.

15. The circuit of claim 14, wherein the second power selection unit comprises:
   a first NMOS transistor that outputs a substrate voltage to the back gate of the second MOS transistor according to the output signal; and
   a second NMOS transistor that outputs a ground voltage to the back gate of the second MOS transistor according to the output signal of the dynamic logic.

16. The circuit of claim 9, wherein the dynamic logic further comprises a logic circuit having a plurality of transistors coupled in series between the first and second MOS transistors, wherein the plurality of transistors are coupled to receive a plurality of driving signals.

17. A circuit that reduces power consumption in a low voltage integrated circuit comprising:
   a low voltage dynamic logic provided with first MOS transistor having a first conductive type and a second MOS transistor having a second conductive type different from the first conductive type;
   a logic gate that logically processes an output signal of the dynamic logic;
   a first PMOS transistor that outputs a boosting voltage to a back gate of the first MOS transistor according to the output signal of the dynamic logic;
   a second PMOS transistor that outputs a first prescribed voltage to the back gate of the first MOS transistor according to an output signal of the logic gate;
   a first NMOS transistor that outputs a substrate voltage to a back gate of the second MOS transistor according to the output signal of the dynamic logic; and a second NMOS transistor that outputs a second prescribed voltage to the back gate of the second MOS transistor according to the output signal of the logic gate.

18. The circuit of claim 17, wherein the first and second MOS transistors have a low threshold voltage, and wherein the first and second prescribed voltages are a power source voltage and a ground voltage, respectively.

19. The circuit of claim 17, wherein the first MOS transistor is a p-type transistor turned on in a standby state, and the second MOS transistor is a n-type transistor turned on in an active state.

20. The circuit of claim 1, wherein each of the third through sixth transistors is a corresponding circuit.

21. The circuit of claim 1, wherein the dynamic logic further comprises a logic circuit having a plurality of transistors coupled in series between the first and second transistors, wherein the plurality of transistors are coupled to receive a plurality of driving signals.

22. The circuit of claim 9, wherein each of the first and second transistors is part of a corresponding circuit.

23. A circuit for reducing power consumption in a low voltage dynamic logic, comprising:
 a low voltage dynamic logic provided with first MOS transistor having a first conductive type and a second MOS transistor having a second conductive type different from the first conductive type;
 a first power selection unit that applies one of a first prescribed voltage and a second prescribed voltage to a back gate of the first MOS transistor according to an output signal of the dynamic logic; and
 a second power selection unit that applies one of a third prescribed voltage and a fourth prescribed voltage to a back gate of the second MOS transistor according to the output signal of the dynamic logic, wherein the second power selection unit comprises,
  a first transistor that outputs a substrate voltage to the back gate of the second MOS transistor according to the output signal, and
  a second transistor that outputs a ground voltage to the back gate of the second MOS transistor according to the output signal of the dynamic logic.

24. A circuit for reducing power consumption in a low voltage dynamic logic, comprising:
 a low voltage dynamic logic provided with first MOS transistor having a first conductive type and a second MOS transistor having a second conductive type different from the first conductive type;
 a first power selection unit that applies one of a first prescribed voltage and a second prescribed voltage to a back gate of the first MOS transistor according to an output signal of the dynamic logic; and
 a second power selection unit that applies one of a third prescribed voltage and a fourth prescribed voltage to a back gate of the second MOS transistor according to the output signal of the dynamic logic, wherein the dynamic logic further comprises a logic circuit having a plurality of transistors coupled in series between the first and second MOS transistors, wherein the plurality of transistors are coupled to receive a plurality of driving signals.

* * * * *